(12) United States Patent
Honda (10) Patent No.: US 10,605,836 B2
(45) Date of Patent: Mar. 31, 2020

(54) VOLTAGE DETECTION DEVICE

(71) Applicant: DENSO CORPORATION, Kariya, Aichi-pref. (JP)

(72) Inventor: Kazutaka Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 112 days.

(21) Appl. No.: 16/019,688

(22) Filed: Jun. 27, 2018

(65) Prior Publication Data

US 2019/0146011 A1    May 16, 2019

(30) Foreign Application Priority Data

Nov. 15, 2017  (JP) ................. 2017-219991

(51) Int. Cl.
| | | |
|---|---|---|
| *G01R 17/16* | (2006.01) | |
| *H03F 1/02* | (2006.01) | |
| *H03F 3/45* | (2006.01) | |
| *G01R 19/00* | (2006.01) | |

(52) U.S. Cl.
CPC ......... *G01R 17/16* (2013.01); *G01R 19/0084* (2013.01); *H03F 1/0211* (2013.01); *H03F 3/45475* (2013.01); *H03F 2200/27* (2013.01); *H03F 2200/471* (2013.01); *H03F 2203/45116* (2013.01); *H03F 2203/45171* (2013.01)

(58) Field of Classification Search
CPC .............. G01R 31/3658; G01R 31/362; G01R 31/3696; G01R 31/3648
See application file for complete search history.

(56) References Cited

U.S. PATENT DOCUMENTS

| | | | |
|---|---|---|---|
| 5,557,274 A | 9/1996 | Hirooka et al. | |
| 5,745,066 A | 4/1998 | Hirooka et al. | |
| 9,958,505 B2 | 5/2018 | Honda | |
| 2007/0046521 A1 | 3/2007 | Ariyoshi | |
| 2009/0115523 A1 | 5/2009 | Akizuki et al. | |
| 2010/0156683 A1 | 6/2010 | Nozawa et al. | |
| 2016/0091572 A1* | 3/2016 | Fujii ................ | G01R 19/16542 |
| | | | 324/434 |
| 2017/0018945 A1* | 1/2017 | Ohtake .............. | G01R 31/3835 |
| 2017/0123010 A1* | 5/2017 | Sekiguchi .......... | G01R 31/3648 |

FOREIGN PATENT DOCUMENTS

| | | |
|---|---|---|
| JP | 1994-29856 A | 2/1994 |
| JP | 2016-70903 A | 5/2016 |

* cited by examiner

*Primary Examiner* — Tung X Nguyen
(74) *Attorney, Agent, or Firm* — Posz Law Group, PLC (57) ABSTRACT

A voltage detection device comprises a voltage detection circuit, which is a fully-differential type and a control circuit for controlling an operation of the voltage detection circuit. The voltage detection circuit includes a switched capacitor circuit, a differential amplifier, a common mode feedback circuit for controlling a common mode level of an output voltage of the differential amplifier and a bias circuit for supplying biases to the differential amplifier and the common mode feedback circuit. The control circuit controls the voltage detection circuit to execute intermittently a detection operation for detecting the voltage. The control circuit controls the voltage detection circuit to execute a pseudo operation of an execution period, which is shorter than that of the detection operation, during a transition period from a stop state, in which no detection operation is executed, to the operation state, in which the detection operation is executed.

15 Claims, 6 Drawing Sheets

| TIME [ms] | 0 | 2 | 4 | 6 | 8 | 10 | 12 | 14 | 16 | 18 | 20 | 22 | 24 | 26 | 28 | 30 |
|---|---|---|---|---|---|---|---|---|---|---|---|---|---|---|---|---|
| MONITOR SCHEDULE | CELL VOLTAGE DETECTION (AD1) | | | COM-MUNI-CATION | DIAG-NOSIS (AD2) | EQUALIZATION | | COM-MUNI-CATION | CELL VOLTAGE DETECTION (AD1) | | | COM-MUNI-CATION | DIAG-NOSIS (AD2) | COM-MUNI-CATION | DIAG-NOSIS (AD2) | COM-MUNI-CATION |
| CURRENT CONSUMPTION OF AMPLIFIER (a) | 1 | 1 | 1 | 1 | 1 | 1 | 1 | 1 | 1 | 1 | 1 | 1 | 1 | 1 | 1 | 1 |
| (b) | 1 | 1 | 1 | 0 | 1 | 0 | 0 | 0 | 1 | 1 | 1 | 0 | 1 | 0 | 1 | 0 |
| (c) | 1 | 1 | 1 | 0 | 0.5 | 0 | 0 | 0 | 1 | 1 | 1 | 0 | 0.5 | 0 | 0.5 | 0 |

AVERAGE OF (a) = 1.00
AVERAGE OF (b) = 0.56
AVERAGE OF (c) = 0.47

| TIME [ms] | 0 | 2 | 4 | 6 | 8 | 10 | 12 | 14 | 16 | 18 | 20 | 22 | 24 | 26 | 28 | 30 |
|---|---|---|---|---|---|---|---|---|---|---|---|---|---|---|---|---|
| MONITOR SCHEDULE | CELL VOLTAGE DETECTION (AD1) | | | DIAG-NOSIS (AD2) | CELL VOLTAGE DETECTION (AD1) | | | COMMUNI-CATION | CELL VOLTAGE DETECTION (AD1) | | | DIAG-NOSIS (AD2) | COMMUNI-CATION | COMMUNI-CATION | DIAG-NOSIS (AD2) | COMMUNI-CATION |
| CURRENT CONSUMPTION OF AMPLIFIER (a) | 1 | 1 | 1 | 1 | 1 | 1 | 1 | 1 | 1 | 1 | 1 | 1 | 1 | 1 | 1 | 1 |
| (b) | 1 | 1 | 1 | 1 | 1 | 1 | 1 | 0 | 1 | 1 | 1 | 1 | 0 | 0 | 1 | 0 |
| (c) | 1 | 1 | 1 | 0.5 | 1 | 1 | 1 | 0 | 1 | 1 | 1 | 0.5 | 0 | 0 | 0.5 | 0 |

AVERAGE OF (a) = 1.00
AVERAGE OF (b) = 0.75
AVERAGE OF (c) = 0.66

VOLTAGE DETECTION DEVICE

CROSS REFERENCE TO RELATED APPLICATION

The present application is based on Japanese patent application No. 2017-219991 filed on Nov. 15, 2017, the whole contents of which are incorporated herein by reference.

FIELD

The present disclosure relates to a voltage detection device for detecting a voltage.

BACKGROUND

A battery monitor integrated circuit (IC), which monitors a battery such as a lead battery and a lithium-ion battery, includes a voltage detection circuit of a fully-differential configuration for a detection operation for detecting a voltage of a battery. This voltage detection circuit has a function of an A/D converter. In such a battery monitor IC, a differential amplifier included in the A/D converter tends to consume more current for executing an A/D conversion operation at higher speed and with higher precision. Since an increase in a consumed current (current consumption) in the battery monitor IC leads to a variation in a state of charge (SOC) of the battery and an increase of heat generation of the IC, it is necessary to lower the current consumption.

Many conventional technologies are proposed for lowering current consumption of an A/D converter and the like. An intermittent operation will be most effective in an application, in which an A/D conversion is not executed continuously in, for example, a battery monitor IC. For example, in JP 2016-70903A, function blocks are operated intermittently for reducing power consumption.

The intermittent operation for reducing current consumption of the A/D converter will however potentially cause the following problem. That is, the A/D converter needs a stabilization period for stabilization of circuit states before restoring its operable state after stopping its operation once.

The stabilization period is, for example, a convergence period required for stabilization of an operation of a common feedback circuit, which controls a common mode level of an output voltage of an amplifier. In case that the A/D converter needs a comparatively long stabilization period from stopping to restoring its operation, such a stabilization period results in a wasteful wait period and delays a completion of a voltage detection operation.

SUMMARY

It is therefore an object to provide a voltage detection device, which can reduce current consumption while shortening a period required to restore its operation in a stable circuit state.

A voltage detection device comprises a voltage detection circuit configured to be a fully-differential type for detecting a voltage and a control circuit for controlling an operation of the voltage detection circuit. The voltage detection circuit includes a switched capacitor circuit, a differential amplifier, a common mode feedback circuit for controlling a common mode level of an output voltage of the differential amplifier and a bias circuit for supplying biases to the differential amplifier and the common mode feedback circuit. The control circuit is configured to control the voltage detection circuit to execute intermittently a detection operation for detecting the voltage and execute a pseudo operation of an execution period, which is shorter than that of the detection operation, during a transition period from a stop state, during which no detection operation is executed, to an operation state, in which the detection operation is executed.

DETAILED DESCRIPTION OF THE EMBODIMENT

A voltage detection device will be described below with reference to plural embodiments shown in the drawings. Substantially same structural components are designated with the same reference numerals in the embodiments for brevity.

First Embodiment

A first embodiment will be described with reference to FIG. 1 to FIG. 7.

<Whole Configuration>

Figure 1A:
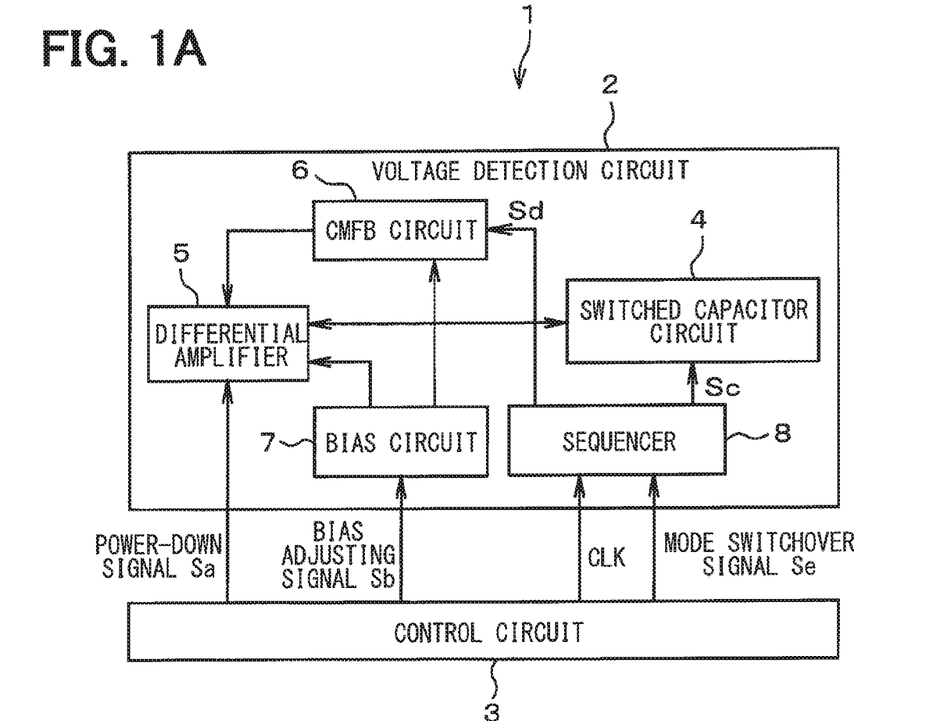
FIG. 1A and FIG. 1B are block diagrams schematically showing configurations of a voltage detection device and a battery pack according to a first embodiment.
Figure 1B:
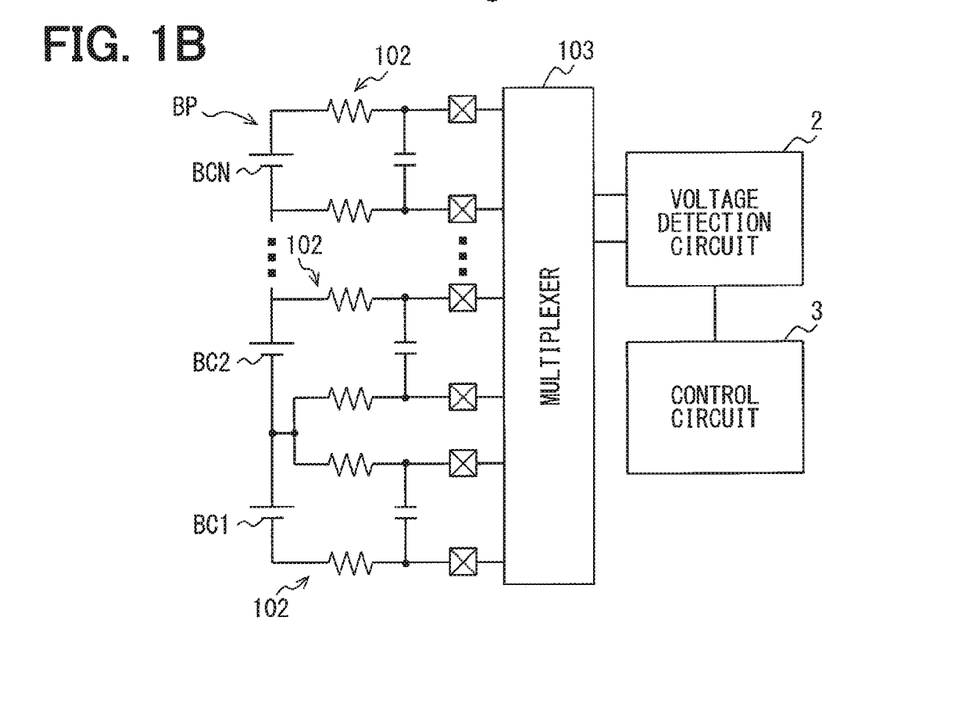

As shown in FIG. 1A and FIG. 1B, a voltage detection device 1 is provided for application to a battery monitor IC, which monitors a battery mounted in a vehicle, for example. The voltage detection device 1 includes a voltage detection circuit 2 of a fully-differential type and a control circuit 3, which controls an operation of the voltage detection circuit 2. The voltage detection circuit 2 is configured to detect terminal voltages of plural battery cells BC1 to BCN, which are connected in series as a battery pack BP and inputted through respective filters 102 and a multiplexer 103. This configuration is conventional as disclosed in, for example, U.S. Pat. No. 9,958,505. The voltage detection circuit 2 has a function of an A/D converter. The voltage detection circuit 2 is configured to execute a detection operation for detecting the voltage by using the function of the A/D converter. The A/D converter is referred to as an ADC below.

In this embodiment, the voltage detection circuit 2 is configured to be capable of switching over a method (type) of A/D conversion, that is, A/D conversion mode, of the ADC. The A/D conversion mode, which is switchable, may be a ΔΣ mode for operating as a ΔΣ-type ADC, a cyclic mode for operating as a cyclic-type ADC and a hybrid mode for operating as a hybrid-type ADC.

The voltage detection circuit 2 includes a switched-capacitor circuit 4, a differential amplifier 5, a common feedback circuit 6, a bias circuit 7, a sequencer 8 and the like. In the following description, the switched-capacitor circuit, the differential amplifier and the common feedback circuit are referred to as an SC circuit, an amplifier and a CMFB circuit, respectively, for brevity.

The switched capacitor circuit 4 includes plural switches and plural capacitors, which are connected to corresponding terminals directly or indirectly of the amplifier 5. The amplifier 5 is configured to stop its operation in response to a power-down signal Sa applied from the control circuit 3. The CMFB circuit 6 controls a common-mode level of an output voltage of the amplifier 5.

The bias circuit 7 is configured to apply desired biases, which are determined based on a bias adjusting signal Sb applied from the control circuit 3, to the amplifier 5 and the CMFB circuit 6. The amplifier 5 is configured to adjust a consumed current (current consumption) in accordance with the bias applied from the bias circuit 7.

The sequencer 8 is configured to output switch changeover signals Sc and Sd for changing over on-states and off-states of switches in the switched capacitor circuit 4 and the CMFB circuit 6. The switch changeover signals Sc and Sd are generated based on a clock signal CLK applied from the control circuit 3. Frequencies of the switch changeover signals Sc and Sd correspond to a frequency of the clock signal CLK. That is, an operation frequency of the SC circuit 4 corresponds to the frequency of the clock signal CLK.

The clock signal CLK and a mode switchover signal Se, which are outputted from the control circuit 3, are applied to the sequencer 8. The sequencer 8 is configured to output the switch changeover signals Sc and Sd for controlling the voltage detection circuit 2 to operate as the ADC under the mode designated by the mode switchover signal Se.

The control circuit 3 is configured to control the amplifier 5 to execute its operation by setting a level of the power-down signal Sa to a non-active level (for example, low level such as 0V). When the amplifier 5 operates, the voltage detection circuit 2 becomes operative and executes a detection operation for detecting a voltage as a normal detection operation. In the present embodiment, the detection operation includes, for example, an operation for detecting a voltage of a battery cell and an operation for diagnosing whether a failure such as a current leak is present in a voltage detection path.

The control circuit 3 controls the amplifier 5 to stop its operation by setting the level of the power-down signal Sa to an active level (for example, high level such as +5V). When the amplifier 5 stops its operation, the voltage detection circuit 2 becomes inoperative and does not execute the detection operation. Under this stop state, the amplifier 5 consumes no current and hence the voltage detection circuit 2 also consumes substantially no current.

The control circuit 3 is configured to control the operation of the voltage detection circuit 2 in response to a command applied from an external side. The command may be applied from a microcomputer, for example, which is provided in the same battery monitor IC as the voltage detection device 1. In the battery monitor IC, the microcomputer outputs, after having outputted a command requesting an execution of a normal detection operation including A/D conversion, a command requesting an execution of a next normal detection operation following a command requesting an execution of a different operation such as communication, for example, in many cases. That is, the microcomputer rarely outputs commands requesting executions of the detection operation continuously.

For this reason, in the present embodiment, the detection operation of the voltage detection circuit 2 is not executed continuously after activation and hence there are surely periods, during which the detection operation is not executed. That is, the voltage detection circuit 2 in the present embodiment does not execute the detection operation continuously but executes it intermittently. The control circuit 3 controls the voltage detection circuit 2 to execute the detection operation intermittently by executing and stopping the operation of the amplifier 5 as described above.

The control circuit 3 is configured to adjust the biases applied to the amplifier 5 and the CMFB circuit 6 by the bias adjusting signal Sb applied to the bias circuit 7. The control circuit 3 controls the current consumption of the amplifier 5 by adjusting the biases as described above. The control circuit 3 is further configured to adjust the operation frequency of the switched capacitor circuit 4 by the clock signal CLK applied to the sequencer 8. The control circuit 3 is configured to control an operation speed of the voltage detection circuit 2 by adjusting the operation frequency of the switched capacitor circuit 4 as described above. The control circuit 3 is further configured to switch over the mode of the ADC by the mode switchover signal Se applied to the sequencer 8.

<Amplifier 5 and Bias Circuit 7>

Figure 2:
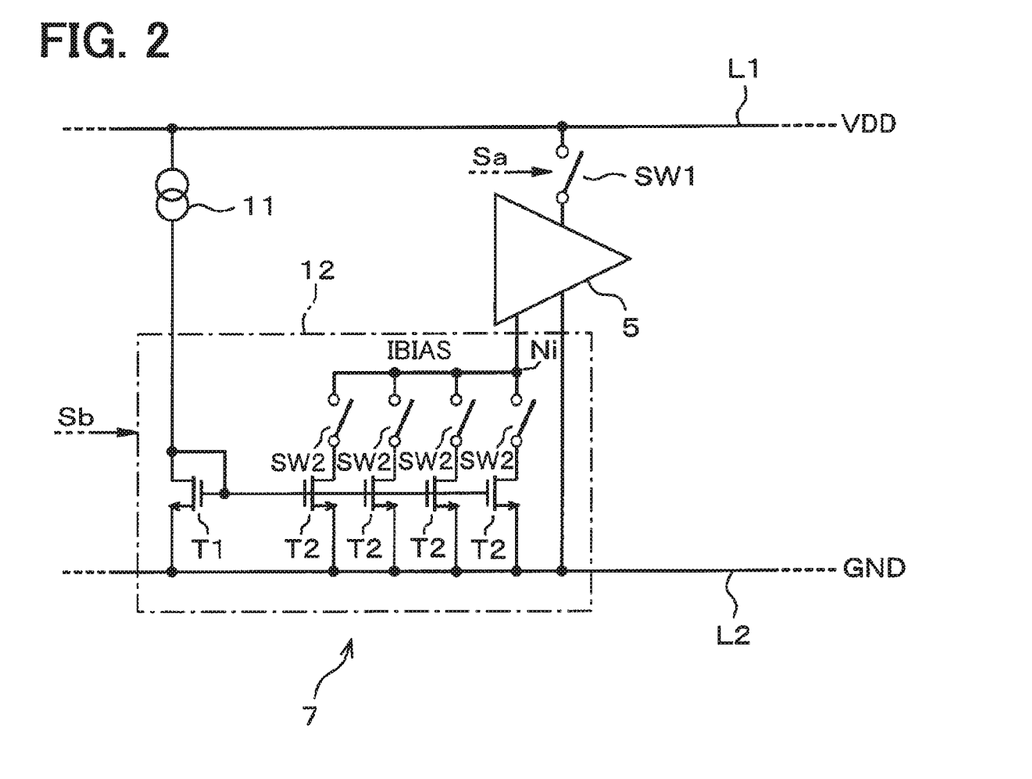
FIG. 2 is a circuit diagram schematically showing in detail an amplifier and a bias circuit according to the first embodiment.

The amplifier 5 and the bias circuit 7 may be configured in detail as shown exemplarily in FIG. 2. As shown in FIG. 2, the amplifier 5 operates with a power supply voltage VDD supplied from a pair of d.c. power supply lines L1 and L2. A switch SW1 is provided for connecting and disconnecting a power supply terminal of the amplifier 5 with the d.c. power supply line L1.

The switch SW1 is controlled to turn on and off by the power-down signal Sa. Specifically, the switch SW1 is turned on and off when the power down signal Sa is at the non-active level and the active level, respectively. With this configuration, the amplifier 5 stops its operation when the power-down signal Sa is at the active level. The amplifier 5 consumes no current in this state.

The bias circuit 7 is configured to generate a bias current IB supplied to the amplifier 5. The bias circuit 7 includes a current supply source 11 and a current mirror circuit 12, which is capable of varying a mirror rate. The current mirror circuit 12 includes a transistor T1 at an input side, plural transistors T2 at an output side and plural switches SW2. The transistors T1 and T2 are both N-channel type MOS transistors. Although four transistors T2 are shown at the output side in FIG. 2, the number of transistors T2 may alternatively be two, three, five or more.

The transistor T1 is in a diode-connected configuration with its source being connected to the power supply line L2 and its drain being connected to the power supply line L1 through the current supply source 11. Gates of four transistors T2 are connected to one another and to a gate of the transistor T1.

Drains of four transistors T2 are connected to an output node Ni of the bias current IBIAS through switches SW2. Sources of four transistors T2 are connected to the power supply line L2, which is a ground (GND). That is, four transistors T2 are connected in parallel between the output node Ni and the power supply line L2 through four corresponding switches SW2.

The current mirror circuit 12 is configured to change the number of parallel connections of four transistors T2 by switching over on-off states of four switches SW2. Thus the current mirror circuit 12 is configured to change the mirror rate. Switchover of the on-state and the off-state of the switches SW2, that is, changing of the mirror rate of the current mirror circuit 12, is controlled based on the bias adjusting signal Sb. The bias circuit 7 adjusts the bias current IBIAS by changing the mirror rate of the current mirror circuit 12.

<CMFB Circuit 6>

A CMFB circuit generally is divided generally into two types. One type is a continuous-time CMFB circuit, which receives and outputs a continuous signal. The other type is a discrete-time CMFB circuit, which processes a periodic or discrete signal intermittently. The continuous-time CMFB circuit is formed of transistors and operational amplifiers and configured to feedback-control an output common mode voltage continuously. As a result, the continuous-time CMFB is advantageous in that the stabilization period is short. However, the continuous-time CMFB is disadvantageous in that the current consumption increases and a range of the feedback control operation is limited because of a use of amplifiers.

Figure 3:
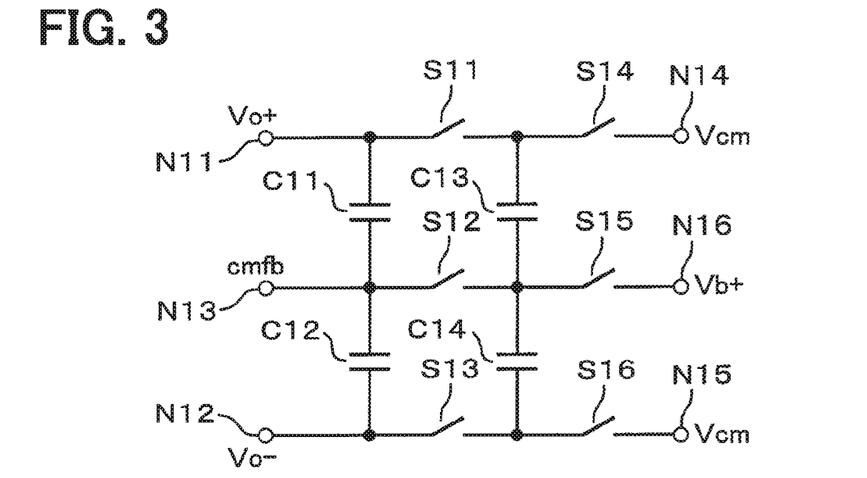
FIG. 3 is a circuit diagram schematically showing in detail one exemplary configuration of a common feedback circuit according to the first embodiment.

For the reasons described above, the CMFB circuit 6 in the present embodiment is configured as the discrete-time CMFB circuit. As shown in FIG. 3, a typical discrete-time CMFB circuit is formed of six switches S11 to S16 and four capacitors C11 to C14, which are connected between nodes N11 to N16.

Output voltages Vo+ and Vo− of the amplifier 5 are applied to the nodes N11 and N12, respectively. A common mode voltage cmfb, which is fed back, is applied to the node N13. The nodes N14 and N15 are provided for outputting signals Vcm, which control the common-mode levels of the output voltages of the amplifier 5. A bias voltage Vb+ is applied to the node N16.

As described above, since the discrete-time CMFB circuit is simple in configuration and basically formed of capacitors and switches, it is advantageous in that the current consumption is small. the discrete-time CMFB circuit however needs the stabilization period, which is comparatively long, depending on its configuration.

Figure 4:
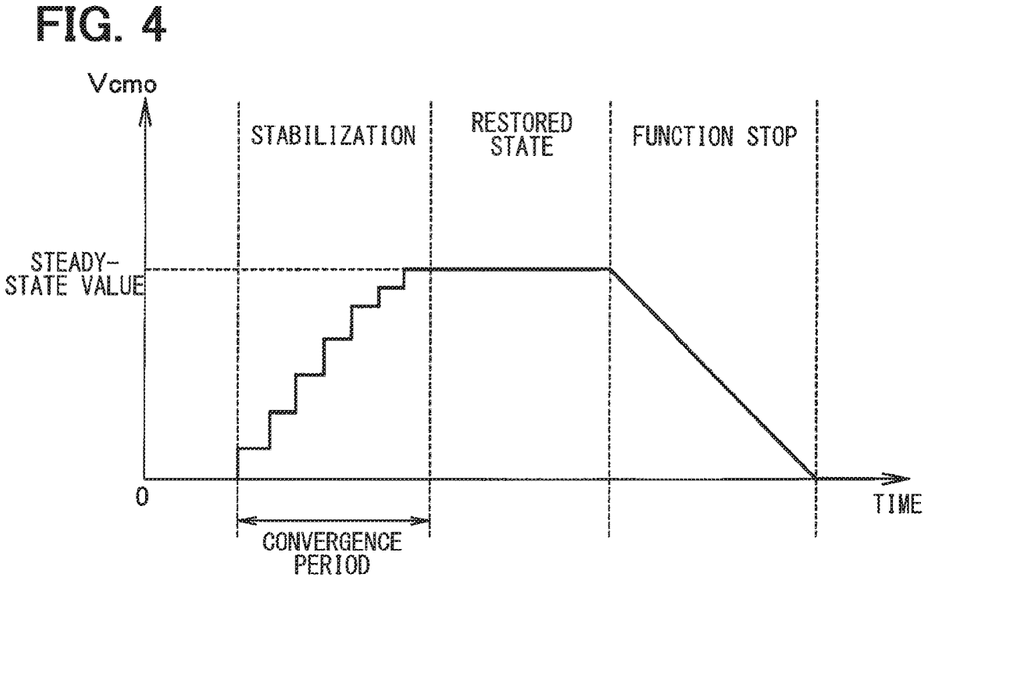
FIG. 4 is a time chart showing a convergence period of the common feedback circuit according to the first embodiment.

As shown in FIG. 4, the discrete-time CMFB circuit needs a predetermined convergence period before stabilization, that is, before an output common voltage Vcmo converges to a steady-state value (restored state value). Further, since the capacitors discharge after stopping of the function in the discrete-time CMFB circuit, the convergence period for re-stabilization increases in case that the function stop continues for a long period such as several milliseconds or more.

<Schedule of Battery Monitor IC>

Figure 5:
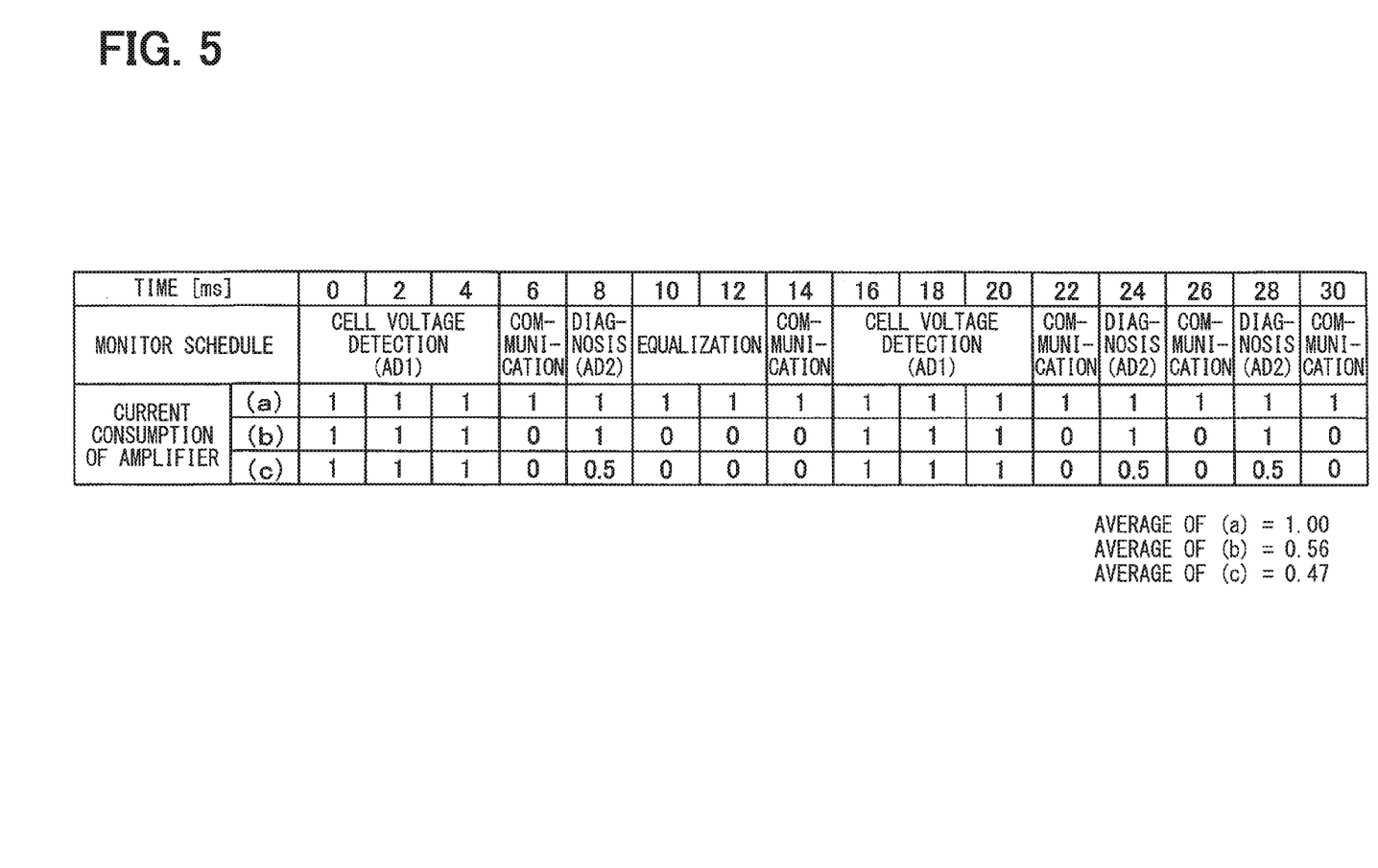
FIG. 5 is an illustration showing one exemplary monitor schedule of a battery monitor IC according to the first embodiment.

The battery monitor IC including the voltage detection device 1 operates based on a schedule as exemplarily shown in FIG. 5. In this case, processing of a cell voltage detection for detecting a voltage of a battery cell, a communication, a failure diagnosis and a cell equalization are executed at a repetition period of several milliseconds. The communication is for communication with a microcomputer mounted in the same battery monitor IC and executed to receive commands and transmit A/D conversion results. The failure diagnosis is executed for diagnosing a disconnection, failure detection in the function blocks and the like. The cell equalization is executed for equalizing the voltages of the battery cells.

<A/D Conversion Method>

Among the operations in the monitor schedule described above, the voltage detection operation including the A/D conversion by the voltage detection device 1 is executed in the cell voltage detection and the diagnosis. The A/D conversion need be executed at different speeds and precisions depending on objects to be detected. Specifically, for the cell voltage detection, the A/D conversion (hereinafter referred to as AD1) is required to be executed at a conversion speed of 100 μs to 1 ms and with a resolving power of 14 to 16 bits. For this reason, a high precision and low speed ADC such as a ΔΣ-type ADC and a hybrid-type ADC is most appropriate for the AD1.

For the A/D conversion (hereinafter referred to as AD2) used for the diagnosis, a conversion speed of 10 μs to 100 μs and a resolving power of 10 to 14 bits are required. For this reason, a middle speed and middle precision ADC such as a hybrid-type ADC, a cyclic-type ADC and a successive approximation-type (SAR) ADC is most appropriate for the AD2.

Figure 6:
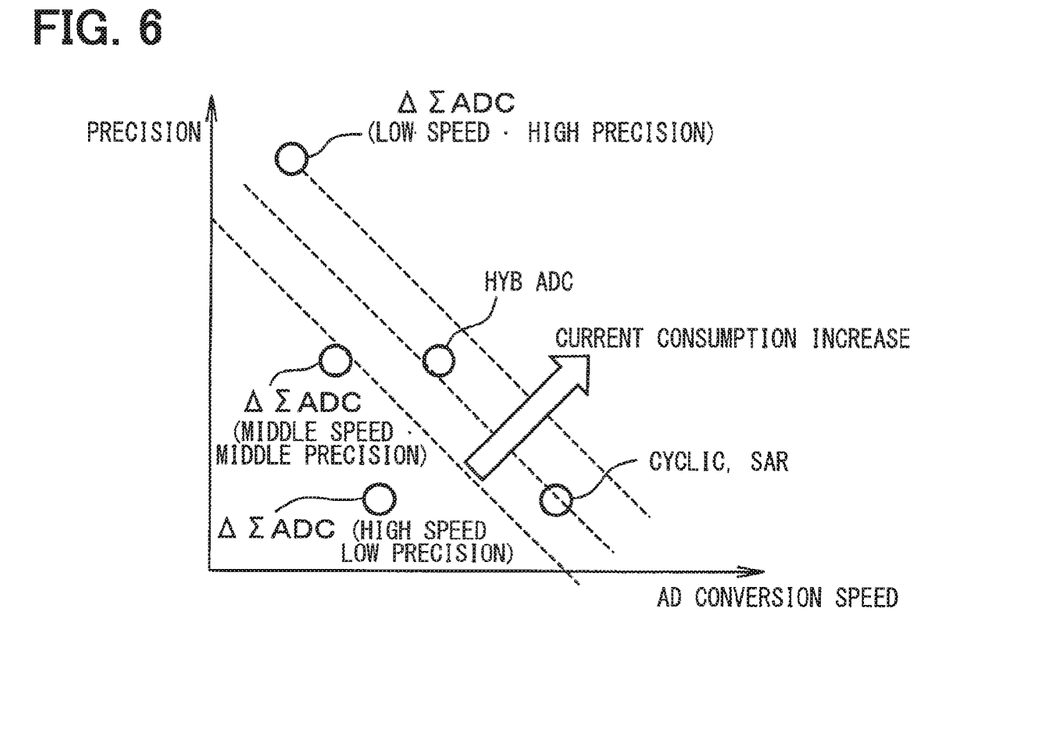
FIG. 6 is a graph showing relations between conversion speeds and precisions in a variety of A/D converters according to the first embodiment.

As shown in FIG. 6, the precision and the conversion speed are in a trade-off relation in the ADC. The trade-off relation is fixed generally for each ADC method (type). The trade-off relation of the ΔΣ-type ADC varies with the oversampling rate and the like. For this reason, in FIG. 6, three kinds of the ΔΣ-type ADCs, that is, low speed and high precision type, middle speed and middle precision type and high speed and low precision type, are shown. Further, as shown in FIG. 6, as the conversion speed and the precision of the ADC increase, the current consumption of the amplifier 5 and the frequency of the clock signal CLK increase.

According to the present embodiment, the ΔΣ-type ADC, which is of the low speed and high precision, is used for the AD1 and the hybrid-type ADC is used for the AD2. For this reason, the voltage detection circuit 2 is switched over to the ΔΣ operation mode in case of the cell voltage detection processing. Further, the voltage detection circuit 2 is switched over to the hybrid operation mode in case of the diagnosis processing.

As shown in FIG. 6, the current consumed by the amplifier 5 required in the ΔΣ-type ADC of the low speed and high precision is larger than that of the amplifier 5 required in the hybrid-type ADC. As a result, the current consumption of the amplifier 5 in the AD1 is larger than that of the amplifier 5 in the AD2. According to the present embodiment, the current consumptions of the amplifier 5 in the AD1 and AD2 are expressed as follows, for example. AD1:AD2=1:0.5

<Current Consumption of Amplifier>

Similarly to the conventional device, a current of a steady-state value flows in the amplifier 5 even in the operation stop state, in case that the operation of the amplifier 5 is not stopped under the operation stop state of the detection operation. In this case, as shown in (a) of FIG. 5, the current of steady-state value flows in the amplifier 5 in any of the processing of cell voltage detection, communication, diagnosis and equalization.

Further, in case that the amplifier 5 is not configured to be able of adjust the current consumption as in the conventional device, an operation characteristic of the amplifier 5 need be determined so that the AD1 of high required-specification is enabled to consume necessary current. In this case, the steady-state value of current is a value of current, which is required in the AD1.

The current consumption of the amplifier 5 in FIG. 5 indicates a value assuming that the steady-state value is "1." According to the present embodiment, on the contrary, the detection operation of the voltage detection circuit 2 is executed intermittently. Accordingly, in the present embodiment, the amplifier 5 is controlled to operate and not to operate when the detection operation is executed and not executed, respectively. That is, in the present embodiment, the amplifier 5 operates only intermittently and consumes no current during a period of stopping its operation.

Since the amplifier 5 is controlled to operate intermittently, the current consumption of the amplifier 5 is "1" during the period of the cell voltage detection and the diagnosis and "0" during the period of the communication and the equalization as shown in (b) of FIG. 5. Further, in the present embodiment, the bias current and the frequency of the clock signal CLK supplied to the amplifier 5 are adjustable. In the present embodiment, therefore, the bias current and the frequency of the clock signal CLK are adjusted so that the current consumption in each of the AD1 and AD2 is most appropriate.

Specifically, the bias current and the clock signal frequency are adjusted so that the current consumption of the amplifier 5 in the AD1 and AD2 is "1" and "0.5," respectively. By combining the current adjustment described above and the intermittent operation of the amplifier 5, the current consumption of the amplifier 5 is "1" during the cell voltage detection, "0.5" during the diagnosis and "0" during the communication and equalization.

As described above, the current consumption of the amplifier 5 in the present embodiment is reduced in comparison to that of the conventional device. Specifically, as shown in FIG. 5, an average value of the current consumption in the present embodiment is "0.47" relative to an average value of the current consumption in the conventional device, which is assumed to be "1." That is, the average current consumption in the present embodiment is reduced to about one-half of the average current consumption of the conventional device. It is noted in the present embodiment that the amplifier 5 may alternatively be controlled to operate only intermittently without current adjustment described above. Even in such an alternative control, an average value of the current consumption is reduced to "0.56," which is lower than that of the amplifier in the conventional device.

<Operation of Voltage Detection Circuit>

As described above, the control circuit 3 controls the operation of the voltage detection circuit 2 to execute the detection operation intermittently. The control circuit 3 further controls the voltage detection circuit 2 to execute a pseudo operation during a transition period, which is from the operation stop state (no execution) of the detection operation to the operation state (execution) of the detection operation. This transition period is shorter than that of the detection operation.

In case of the monitor schedule shown in FIG. 5, the pseudo operation is executed in a transition period from the communication to the cell voltage detection and in a transition period from the communication to the diagnosis. The transition period is not shown in FIG. 5. The pseudo operation executed during the transition period from the communication to the cell voltage detection will be described below. The pseudo operations will also be executed similarly during the transition period from the communication to the diagnosis.

Figure 7:
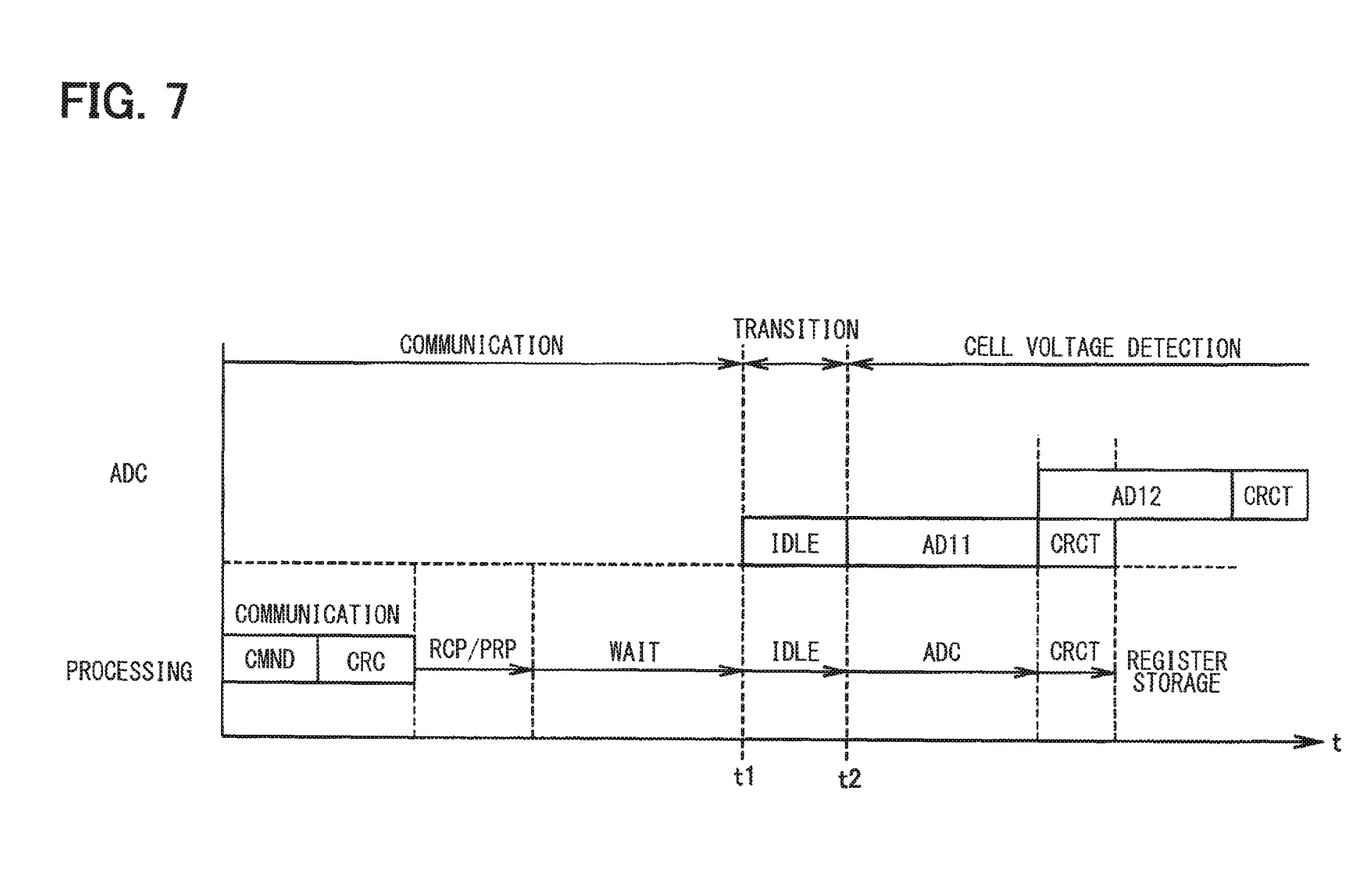
FIG. 7 is a time chart showing an operation in a transition period, which is from communication to cell voltage detection in the first embodiment.

As shown in FIG. 7, an idling is executed as the pseudo operation during the transition period, which is from time t1 of a completion of a series of operations related to the communication to time t2 of a start of the cell voltage detection. That is, in this example, the idling is executed immediately before the actual A/D conversion operation executed in the cell voltage detection. This A/D conversion operation includes a plurality of A/D conversions indicated as AD11 and AD12, which are sequentially executed for the first battery cell BC1 and the second battery cell BC2, respectively, for example. The idling is an operation, which is executed similarly to the actual detection operation without any input voltage as the object of detection. The period of this execution is shorter than that of the detection operation.

The A/D conversion method used for idling may be selected out of plural methods, which execute one A/D conversion (hereinafter referred to as one conversion) during a period equal to or longer than a convergence period required for at least the CMFB circuit 6 to operate stably. However, in case that the period of one conversion is unduly long, time for waiting is wasted. It is therefore desired to select a minimum necessary method, which satisfies the condition described above. In the present embodiment, accordingly, the hybrid ADC, a conversion period of which is short, or the ΔΣ-type ADC, which is high speed and low precision type, is used for the idling. The voltage detection circuit 2 is thus switched over to the hybrid mode or the ΔΣ mode in case of the idling. In this case, although the actual A/D conversion needs about 580 μs for one conversion in the cell voltage detection, the idling execution needs only about 8 μs. For this reason, addition of the idling will not affect adversely so much relative to a total conversion period.

The present embodiment described above provides the following advantages. The control circuit 3 controls the operation of the voltage detection circuit 2 so that the detection operation for detecting the voltage is executed intermittently. As a result, since the detection operation is executed intermittently, the current consumption by the various circuits including the amplifier 5 under the operation stop state, in which no detection operation is executed, is reduced significantly. Since the current consumption of the amplifier 5 under the operation stop state is 0, the current consumption of the voltage detection circuit 2 is also reduced to almost 0.

However, in executing the intermittent operation, the stabilization period is needed to return to restore the detection operation after having once stopped the detection operation. In transferring from the operation stop state to the execution state of the detection operation, the detection operation may be restarted after waiting for stabilization of a circuit state of each circuit. In this case, the stabilization period varies with the monitor schedule of the battery monitor IC. When an interval from the previous detection operation to the present detection operation is comparatively long, for example, waiting for the stabilization may become unnecessary. When the interval is comparatively long, the waiting for the stabilization is necessary at every detection operation and the battery monitor schedule is tightened. As a result, efficiency of other processing such as the failure diagnosis and battery equalization is potentially lowered.

In the present embodiment, however, the control circuit 3 controls the operation of the voltage detection circuit 2 so that the idling is executed as the pseudo operation, the execution period of which is shorter than that of the actual detection operation, during the transition period from transferring from the operation stop state to the operation state. In this case, the A/D conversion method to be used in the idling is determined so that the execution period of the idling generally equals the necessary minimum period, which is required for the stabilization of the circuit state. By executing the idling by the voltage detection circuit 2, the circuit state of each circuit forming the voltage detection circuit 2 is stabilized surely. The execution period of the idling is shorter than that of the detection operation.

It is thus possible to quantify the stabilization period, which is required for the circuit state of each circuit forming the voltage detection circuit 2, as the execution period of idling, which is a comparatively short period. That is, since the stabilization period does not vary with the monitor schedule, the stabilization period does not extend even in case that the interval between the previous detection operation to the present detection operation becomes comparatively long. As described above, the present embodiment is advantageous in that the current consumption is reduced while shortening the period, which is required to restore the operation in the stabilized circuit state.

According to the present embodiment, the idling executed as the pseudo operation is executed only during the convergence period required for at least the CMFB circuit 6 to operate stably. When the CMFB circuit 6 stops its function, electricity is discharged from the capacitor, which is a structural component of the CMFB circuit 6. For this reason, in case that the stop period is long, the convergence period is necessitated for stabilization to the restoration of the operation. The convergence period of the CMFB circuit 6 is generally longer than a period, which is required for other circuits of the voltage detection circuit 2 to restore its operation or be stabilized.

Therefore, by executing the idling only during the convergence period, it is possible to quantify the stabilization period, which is required for the circuit state of each circuit in the voltage detection circuit 2 to be stabilized, to the shortest period. As a result, according to the present embodiment, it is possible to surely suppress the wasteful wait period between the detection operations executed intermittently.

In the battery monitor IC, the multiplexer needs a switchover resetting period in each transition period from the communication to the cell voltage detection and the transition period from the communication to the diagnosis. The switchover resetting period means a period required for convergence of noise variation arising from the discharging of electricity stored in a high-voltage capacitor. That is, in the battery monitor IC, the switchover resetting period is included originally in the transition period.

It is preferred to execute the idling in at least a portion of the switchover resetting period, which is originally present. With this overlapping of the idling with at least the portion of the switchover resetting, it is possible to suppress the wasteful wait period arising from the detection operation executed intermittently.

As shown in FIG. 5, since the detection operation is executed intermittently in the present embodiment, it is possible to greatly reduce the average current consumed in the amplifier 5 in comparison to the conventional device, which executes the detection operation continuously. Further, according to the present embodiment, the bias current and the frequency of the clock signal CLK are adjusted to most optimum consumption currents, respectively, in the AD1 and AD2. With this adjustment, it is possible to reduce the average current consumption of the amplifier 5 in the present embodiment to be equal to or less than one-half of the average current consumption in the conventional device.

Second Embodiment

A second embodiment will be described next with reference to FIG. 8. In the second embodiment, the control circuit 3 is configured to control the operation of the voltage detection circuit 2 differently from the first embodiment. Since the configuration is the same as that of the first embodiment, FIG. 1A, FIG. 1B and the like are referred to.

Figure 8:
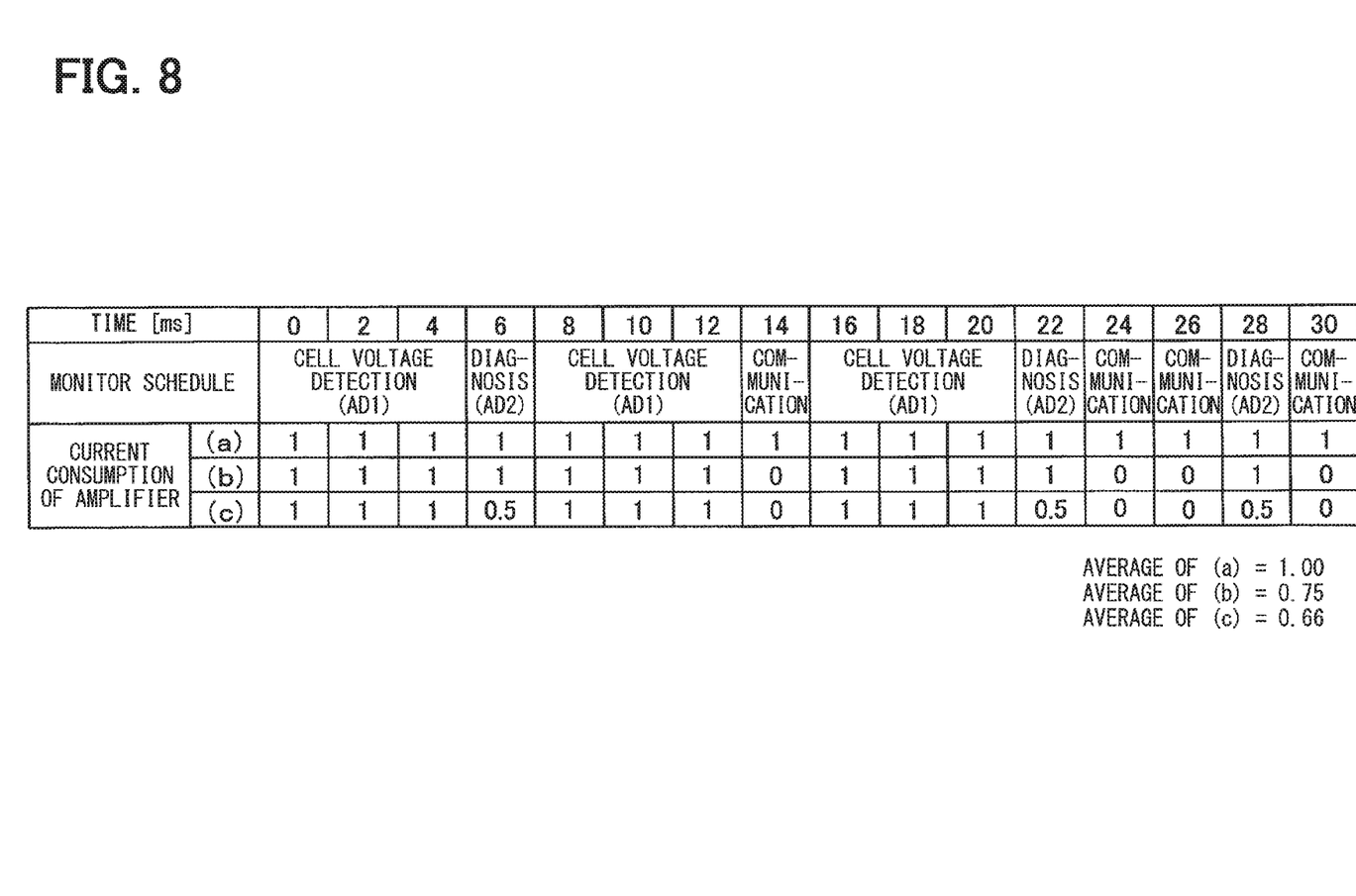
FIG. 8 is an illustration showing one exemplary monitor schedule of a battery monitor IC according to a second embodiment.

As shown in FIG. 8, in case that the detection operations are continuously executed in the sequence of the cell voltage detection, the diagnosis and the cell voltage detection, according to the monitor schedule, the circuit state and the operation state of the voltage detection circuit 2 including the amplifier 5 are stable at the transition from the cell voltage detection to the diagnosis and at the transition from the diagnosis to the cell voltage detection. For this reason, the control circuit 3 in the present embodiment controls the operation of the voltage detection circuit 2 so that the idling, which is the pseudo operation, is not executed during the transition period when the detection operations continue.

Further, in case that the execution period of the operation (for example, communication) executed between two successive detection operations is sufficiently short and the circuit state is stable even at the operation stop of the amplifier 5, the pseudo operation for stabilizing the circuit state need not be executed.

Accordingly, in the present embodiment, the control circuit 3 controls the operation of the voltage detection circuit 2 so that no pseudo operation is executed during the transition period when the stop period, during which the stop state continues, is shorter than a predetermined period. The predetermined period may be set in accordance with a period, during which the circuit state and the like of the voltage detection circuit 2 are stable even in case that the operation of the amplifier 5 is stopped. The predetermined period may be measured by using a counter.

The second embodiment also provides the similar advantages as the first embodiment. Further, according to the present embodiment, the idling is executed as the pseudo operation only in case that the circuit state and the like will not be maintained in the stabilized state because of stopping of the operation of the amplifier 5. For this reason, it is possible to further reduce the wasteful waiting time in comparison to a case that the pseudo operation is executed at every transition period.

Other Embodiment

The voltage detection device should not be limited to the embodiments described above with reference to the drawings but may be arbitrarily modified or combined. The numerical values referred to in the embodiments are exemplary and not limiting.

In the embodiments described above, the amplifier 5 is configured to be able to reduce the current consumption to zero under the stop state. However, the amplifier 5 may be configured to reduce the current consumption under the stop state by more than a predetermined value in comparison to the current consumption under the operation state. The detailed configuration may be changeable arbitrarily.

In the embodiments described above, the voltage detection device 1 is configured to include the voltage detection circuit 2, which has the function as the A/D converter. However, the voltage detection device may be configured to include a voltage detection circuit, which has a function of a level shift circuit. Particularly in the battery monitor IC, both of the level shift circuit and the A/D converter are provided for detecting the voltage of the battery cell. The level shift circuit and the A/D converter are configured similarly. Therefore, even in the voltage detection device provided with the voltage detection circuit configured to have the function as the level shift circuit, it is possible to execute the intermittent operation and the pseudo operation and provide the similar function and advantages.

In the embodiments described above, the voltage detection device is exemplarily applied to the battery monitor IC. However, the voltage detection device may be applied to any other apparatuses and systems, which execute voltage detection operations intermittently.

What is claimed is:

1. A voltage detection device comprising:
   a voltage detection circuit configured to be a fully-differential type for detecting a voltage, the voltage detection circuit including a switched capacitor circuit, a differential amplifier, a common mode feedback circuit for controlling a common mode level of an output voltage of the differential amplifier and a bias circuit for supplying biases to the differential amplifier and the common mode feedback circuit; and
   a control circuit for controlling an operation of the voltage detection circuit,
   wherein the control circuit is configured to control the voltage detection circuit to execute intermittently a detection operation for detecting the voltage and execute a pseudo operation of an execution period, which is shorter than that of the detection operation, during a transition period from a stop state, during which no detection operation is executed, to an operation state, in which the detection operation is executed.

2. The voltage detection device according to claim 1, wherein:
   the control circuit is configured to execute the pseudo operation only during a convergence period required for at least an operation of the common mode feedback circuit is stabilized.

3. The voltage detection device according to claim 1, wherein:
   the control circuit is configured to control the voltage detection circuit not to execute the pseudo operation during the transition period when a stop period, which is a period of continuation of the stop state, is equal to or shorter than a predetermined period.

4. The voltage detection device according to claim 1, wherein:
   the voltage detection circuit is configured to reduce a current consumption in the stop state to zero or save the current consumption in the stop state by at least a predetermined value relative to a current consumption in the operation state.

5. The voltage detection device according to claim 1, wherein:
   the control circuit is configured to control an operation speed of the voltage detection circuit by adjusting an operation frequency of the switched capacitor circuit.

6. The voltage detection device according to claim 1, wherein:
   the control circuit is configured to control a current consumption of the differential amplifier by adjusting the bias.

7. The voltage detection device according to claim 1, wherein:
   the voltage detection circuit is configured to have a function of an A/D converter.

8. The voltage detection device according to claim 7, wherein:
   the voltage detection circuit is configured to switch over an A/D conversion method of the A/D converter.

9. The voltage detection device according to claim 1, wherein:
   the voltage detection circuit is configured to have a function of a level-shift circuit.

10. The voltage detection device according to claim 1, wherein:
    the control circuit is configured to control the voltage detection circuit based on a command applied from an external side.

11. The voltage detection device according to claim 1, wherein:
    the control circuit is configured to control the voltage detection circuit to execute the detection operation without any application of the voltage.

12. The voltage detection device according to claim 2, wherein:
    the control circuit is configured to control the voltage detection circuit not to execute the pseudo operation during the transition period when a stop period, which is a period of continuation of the stop state, is equal to or shorter than a predetermined period.

13. The voltage detection device according to claim 12, wherein:
    the voltage detection circuit is configured to reduce a current consumption in the stop state to zero or save the current consumption in the stop state by at least a predetermined value relative to a current consumption in the operation state.

14. The voltage detection device according to claim 12, wherein:
    the control circuit is configured to control an operation speed of the voltage detection circuit by adjusting an operation frequency of the switched capacitor circuit.

15. The voltage detection device according to claim 12, wherein:
    the control circuit is configured to control a current consumption of the differential amplifier by adjusting the bias.

* * * * *